United States Patent [19]
Park et al.

[11] Patent Number: 5,859,760
[45] Date of Patent: Jan. 12, 1999

[54] MICROELECTRONIC CAPACITORS HAVING TANTALUM PENTOXIDE DIELECTRICS AND OXYGEN BARRIERS

[75] Inventors: In-sung Park; Kyung-hoon Kim, both of Seoul, Rep. of Korea

[73] Assignee: Samsung Electronics Co., Ltd., Suwon, Rep. of Korea

[21] Appl. No.: 843,799

[22] Filed: Apr. 21, 1997

Related U.S. Application Data

[62] Division of Ser. No. 709,249, Sep. 10, 1996.

[30] Foreign Application Priority Data

Sep. 13, 1995 [KR] Rep. of Korea .................. 95-29828

[51] Int. Cl.⁶ ........................................... H01G 4/06
[52] U.S. Cl. ................. 361/313; 361/321.5; 438/240; 438/250; 257/310; 257/528
[58] Field of Search ............... 361/303, 306.1, 361/306.3, 311, 312, 313, 320, 321.1–321.5, 322; 438/240, 778, 250; 257/301, 303, 306, 308, 310, 312, 295, 296, 316, 313, 528

[56] References Cited

U.S. PATENT DOCUMENTS

| 4,621,277 | 11/1986 | Ito et al. | 257/313 |
| 5,330,931 | 7/1994 | Emesh et al. | 438/3 |
| 5,394,000 | 2/1995 | Ellul et al. | 257/301 |
| 5,452,178 | 9/1995 | Emesh et al. | 361/303 |
| 5,554,870 | 9/1996 | Fitch et al. | 257/334 |
| 5,569,619 | 10/1996 | Roh | 438/396 |

*Primary Examiner*—Kristine L. Kincaid
*Assistant Examiner*—Anthony Dinkins
*Attorney, Agent, or Firm*—Myers Bigel Sibley & Sajovec

[57] ABSTRACT

A microelectronic capacitor is formed by nitrating the surface of a conducting electrode on a microelectronic substrate. The nitrated surface of the conductive electrode is then oxidized. The nitrating and oxidizing steps collectively form a film of silicon oxynitride on the conductive electrode. A tantalum pentoxide film is then formed on the oxidized and nitrated surface of the conductive electrode. The tantalum pentoxide film may then be thermally treated in the presence of oxygen gas. High performance microelectronic capacitors are thereby provided.

4 Claims, 5 Drawing Sheets

MICROELECTRONIC CAPACITORS HAVING TANTALUM PENTOXIDE DIELECTRICS AND OXYGEN BARRIERS

This application is a divisional of application Ser. No. 08/709,249, filed Sep. 10, 1996.

FIELD OF THE INVENTION

This invention relates to microelectronic structures, and more particularly to microelectronic capacitors.

BACKGROUND OF THE INVENTION

Microelectronic capacitors are becoming increasingly important in microelectronic devices. For example, microelectronic capacitors are widely used in integrated circuit memory devices, such as dynamic random access memory (DRAM) devices. Moreover, as the integration density of memory devices continues to increase, memory devices having larger per-unit area capacitance are often needed to compensate for the reduced capacitor size. Thus, much research has been performed to obtain larger capacitance in submicron devices.

As is well known to those having skill in the art, a capacitor includes first and second spaced-apart conductive electrodes with a dielectric therebetween. The first conductive electrode is often referred to as a storage electrode and the second conductive electrode is often referred to as a plate electrode.

Efforts have been made to obtain larger capacitance in microelectronic capacitors by increasing the dielectric constant of the dielectric. Many materials have been investigated for their high dielectric constant. For example, tantalum pentoxide ($Ta_2O_5$) has been widely used but has produced problems of unacceptably large leakage current in thin films thereof.

FIGS. 1A–1C are cross-sectional views illustrating a conventional microelectronic capacitor including a tantalum pentoxide dielectric during intermediate fabrication steps. As shown in FIG. 1C, a capacitor is formed on a semiconductor substrate 11 and is preferably formed on an interlayer insulation layer 13 on the semiconductor substrate 11. A contact hole 14 in the interlayer insulation layer 13 may be provided. Storage electrode 15 may extend through the contact hole 14 to contact a microelectronic device in the semiconductor substrate 11 (not shown). A nitride film 17 is formed on storage electrode 15 for purposes which will be described below. A dielectric film 19 comprising tantalum pentoxide is then formed on nitride layer 17. A plate electrode 20 is formed on dielectric film 19 to complete the capacitor.

Referring again to FIGS. 1A–1C, a method of fabricating a conventional integrated circuit capacitor will now be described. As shown in FIG. 1A, an insulation material is deposited on a semiconductor substrate 11 having a transistor or other active device (not shown) therein. Then, a contact hole 14 and an interlayer insulation layer 13 are formed, for example, by etching the insulation material to expose the face of the semiconductor substrate 11. For example, the source region of a transistor (not shown) may be exposed. A conductive material is then deposited on the interlayer insulation layer 13. The conductive material fills the contact hole 14. The conductive material is then etched to form the storage electrode 15 over the contact hole 14. The conductive material may include for example silicon, polysilicon, amorphous silicon, and/or other conventional conductive materials.

Referring now to FIG. 1B, a silicon nitride ($Si_3N_4$) film 17, also referred to herein as a nitride film, is formed on the storage electrode 15. The nitride film 17 acts as an oxygen barrier. The nitride film 17 may be formed by nitrating the surface of the storage electrode 15 using ammonia. As is well known, the purpose of the nitride film 17 is to reduce, and preferably prevent, the growth of an oxide film between the storage electrode 15 and the dielectric film which is subsequently formed.

Referring now to FIG. 1C, a dielectric film 19 is formed. Dielectric film 19 is preferably tantalum pentoxide. The semiconductor substrate 11, including the dielectric film 19 is then thermally treated using dry oxygen ($O_2$). The dry $O_2$ treatment reduces or prevents leakage current from increasing due to oxygen vacancies in the dielectric film 19. The dry $O_2$ treatment is preferably performed at 800° C. for 30 minutes. A plate electrode 20 is then formed on tantalum pentoxide film 19 using conventional methods.

Unfortunately, it has been found that an ammonia ($NH_3$) radical is produced on the surface of the nitride film 17 which may cause damage to the dielectric film 19 and thereby increase the leakage current. Moreover, since the thickness of the dielectric film 19 and the nitride film 17 generally determine the capacitance of the capacitor, the nitride film 17 should be thin. Accordingly, limitations on the thickness of the nitride film 17 may prevent the complete suppression of the growth of the oxide film between the storage electrode 15 and the dielectric film 19. This oxide film therefore increases the thickness of the dielectric film 19 and may reduce the overall capacitance of the capacitor.

SUMMARY OF THE INVENTION

It is therefore an object of the present invention to provide improved microelectronic capacitors.

It is yet another object of the present invention to provide improved microelectronic capacitors having tantalum pentoxide dielectrics.

It is still another object of the present invention to provide microelectronic capacitors which can reduce growth of oxide film between a storage electrode and a tantalum pentoxide dielectric film thereof.

These and other objects are provided, according to the present invention, by forming a silicon oxynitride (SiON) film as an oxygen barrier between a storage electrode and a tantalum pentoxide ($Ta_2O_5$) dielectric film of a microelectronic capacitor. The silicon oxynitride film acts as an oxygen barrier which can be stronger than a conventional nitride film. Thus, the dielectric film can be made thinner.

In a preferred method according to the present invention, the surface of a conductive electrode on a microelectronic substrate is nitrated. The nitrated surface of the conductive electrode is then oxidized. The nitrating and oxidizing steps may collectively form a film of silicon oxynitride on the conductive electrode. A tantalum pentoxide film is then formed on the oxidized and nitrated surface of the conductive electrode. It has been found that residual ammonia radicals which remain on the nitrated surface of the conductive electrode are reduced or eliminated during the oxidizing step, thus reducing damage to the dielectric film. Accordingly, leakage current characteristics can be improved.

According to another aspect of the present invention, the tantalum pentoxide film forming step is followed by the step of thermally treating the tantalum pentoxide film in the presence of oxygen gas. The oxygen treatment prevents leakage current from increasing due to oxygen vacancies in the dielectric.

Nitration may be performed using a rapid thermal processing system or a conventional furnace. The nitrated microelectronic substrate is preferably transferred to a nitration and/or oxidizing station under a vacuum load lock and/or using a nitrogen purge. The nitration is preferably performed at a temperature of about 800° C. to about 900° C. for times of about 10 seconds to about 200 seconds. Nitration is preferably performed using $NH_3$, $N_2O$, $N_2$, other nitrogen containing gases, or combinations thereof.

A microelectric capacitor according to the invention includes a conductive electrode on a microelectronic substrate. A silicon oxynitride layer is provided on the conductive electrode opposite the microelectronic substrate. A tantalum pentoxide layer is provided on the silicon oxynitride layer, opposite the conductive electrode. A second conductive electrode is provided on the tantalum pentoxide layer opposite the silicon oxynitride layer. High performance microelectronic capacitors are thereby provided.

DETAILED DESCRIPTION OF PREFERRED EMBODIMENTS

Figure 1A:
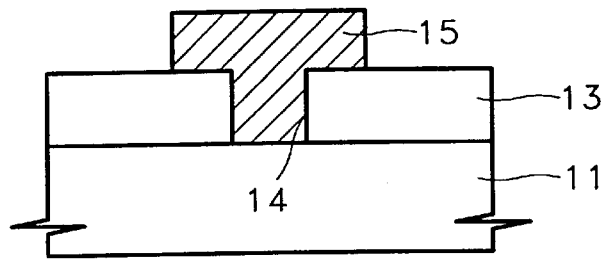
FIGS. 1A–1C are cross-sectional views illustrating a conventional microelectronic capacitor during intermediate fabrication steps.
Figure 1B:
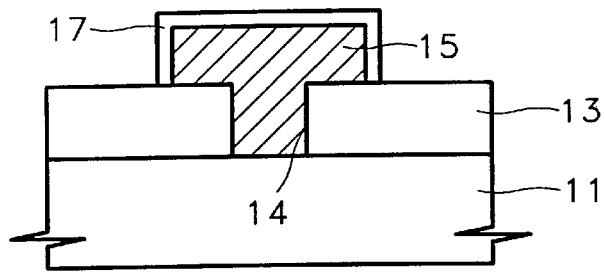
Figure 1C:
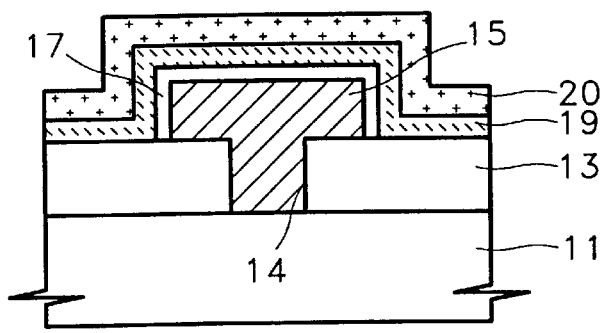

The present invention now will be described more fully hereinafter with reference co the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
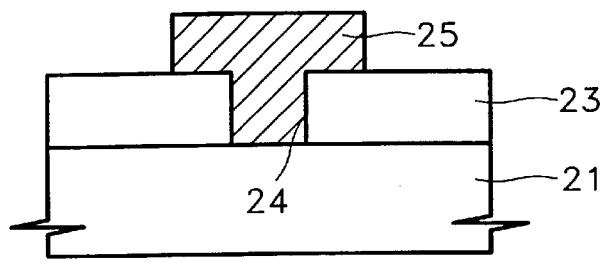
FIGS. 2A–2C are cross-sectional views of a microelectronic capacitor according to the present invention during intermediate fabrication steps.
Figure 2B:
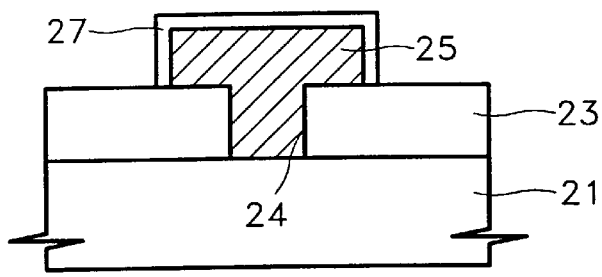
Figure 2C:
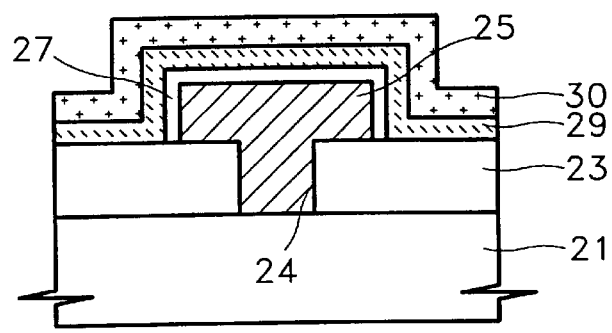

FIGS. 2A–2C are cross-sectional views illustrating a microelectronic capacitor according to the present invention, during intermediate fabrication steps. The completed microelectronic capacitor shown in FIG. 2C includes an interlayer insulation layer 23 on a semiconductor substrate 21. A contact hole 24 is formed in insulation layer 23. A storage electrode 25 on insulation layer 23 fills the contact hole 24. A silicon oxynitride oxygen barrier film 27 is provided on storage electrode 25. A tantalum pentoxide dielectric film 29 is provided on silicon oxynitride layer 27. A conventional plate electrode 30 is provided on the tantalum pentoxide film 29.

Referring now to FIG. 2A, an insulation material is deposited on a semiconductor substrate 21, including a transistor therein (not shown). Then, a contact hole 24 is formed in the insulation material for example, by etching, to expose a source region (not shown) of a transistor or another microelectronic region. The interlayer insulation layer 23 having a contact hole 24 therein is thereby formed.

A conductive material is then formed, for example by deposition, on the interlayer insulation layer 23 to fill the contact hole 24. A storage electrode 25 is then formed over the contact hole 24, for example, by etching the conductive material. The conductive material is preferably a material containing silicon, for example, polysilicon or amorphous silicon. However, other conductive materials and/or combinations thereof may be used.

Referring now to FIG. 2B, an oxygen barrier film 27 is formed of silicon oxynitride (SiON), for example by sequentially nitrating and oxidizing the surface of the storage electrode 25. The nitration is preferably performed by rapid thermal processing (RTP), using ammonia ($NH_3$) gas at about 800° C. to about 900° C. for about 10 seconds to about 200 seconds. As a result, a film of silicon nitride ($Si_3N_4$), also referred to hereto as a nitride film, is formed on storage electrode 25. It will also be understood that rather than ammonia, $N_2O$, $N_2$ and/or other nitrogen containing gases may be used.

Still referring to FIG. 2B, an oxidation is then performed using oxygen ($O_2$) gas, preferably under the same conditions as those for the nitration. The oxidation removes residual ammonia radicals which remain on the surface of the nitride film after the nitration. Also, the silicon nitride ($Si_3N_4$) layer is converted to an oxygen barrier 27 of silicon oxynitride.

Referring again to FIGS. 2A and 2B, after storage electrode 25 is formed, the semiconductor substrate 21 is preferably moved to the station which performs the nitration and/or oxidation processes, using a vacuum load lock. Alternatively, an $N_2$ purge is used before nitration and/or oxidation. The vacuum load lock and/or $N_2$ purge prevents a native oxide film and/or other contaminants from being formed on storage electrode 25 prior to forming the silicon oxynitride film 27.

Referring now to FIG. 2C, the tantalum pentoxide dielectric film 29 is formed by depositing tantalum pentoxide on the surface of the structure. The semiconductor substrate 21 including the dielectric film 29 is then thermally treated using dry $O_2$. A plate electrode 30 is then formed using conventional plate electrode forming steps to thereby complete the capacitor.

Figure 3A:
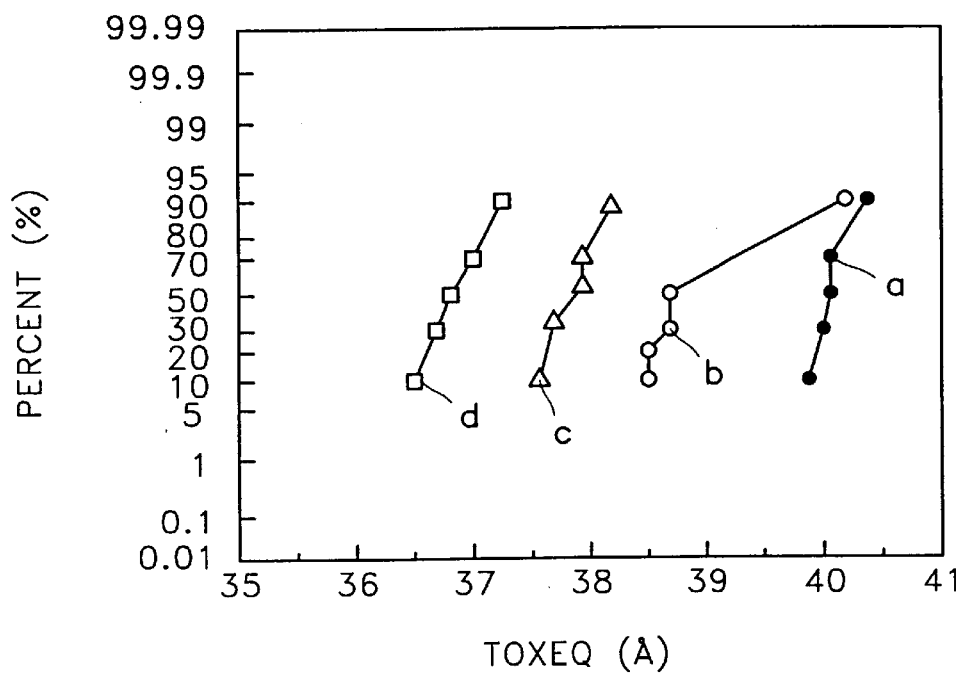
FIGS. 3A and 3B graphically illustrate a distribution of equivalent thicknesses of oxide (TOXEQS) and leakage current distribution when a voltage of 1.5 V is applied to a capacitor including a dielectric film of $Ta_2O_5$ at a thickness of 85Å on a storage electrode, formed under various conditions.
Figure 3B:
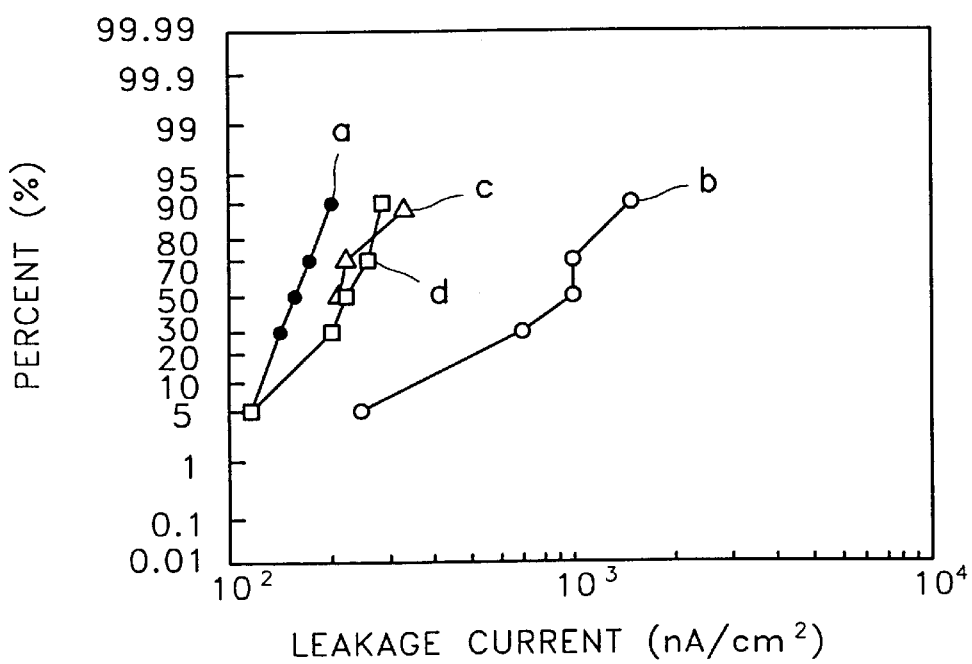

FIGS. 3A and 3B graphically illustrate a distribution of equivalent thicknesses of oxide (TOXEQs) and a leakage current distribution when a voltage of 1.5 V is applied to the capacitor including a dielectric film of $Ta_2O_5$ at a thickness of 85Å on a storage electrode formed under various conditions.

Reference characters a and b indicate results using conventional technology to form dielectric films by depositing $Ta_2O_5$ to a thickness of 85Å after performing rapid thermal nitration (RTN) on the surface of a storage electrode.

Reference character c indicates a dielectric film which is formed according to the present invention by sequentially nitrating the surface of a storage electrode using the RTN method and oxidizing the nitrated surface for a short time (about 60 seconds), thereby forming an oxygen barrier, and then depositing $Ta_2O_5$ at a thickness of 85Å. Reference character d indicates a dielectric film which is formed according to the present invention by sequentially nitrating the surface of a storage electrode using the RTN method and oxidizing the nitrated surface for a relatively long time (about 120 seconds) using a rapid thermal oxidation (RTO) method, thereby forming an oxygen barrier, and then depositing $Ta_2O_5$ at a thickness of 85Å.

Figure 4A:
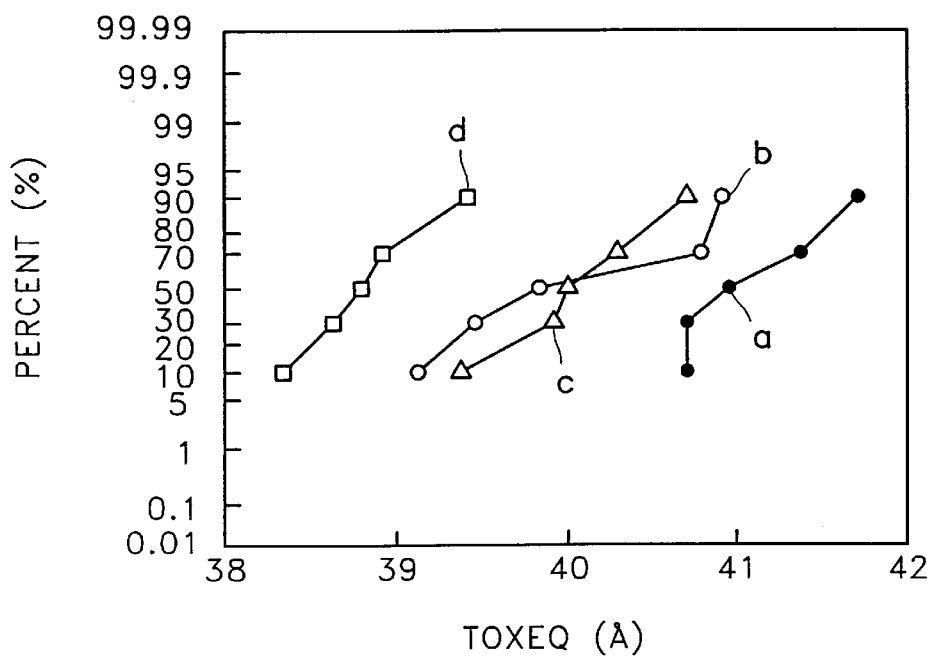
FIGS. 4A and 4B graphically illustrate a distribution of TOXEQs and leakage current distribution when a voltage of 1.5 V is applied to a capacitor including a dielectric film of $Ta_2O_5$ at a thickness of 100Å on a storage electrode, formed under various conditions.
Figure 4B:
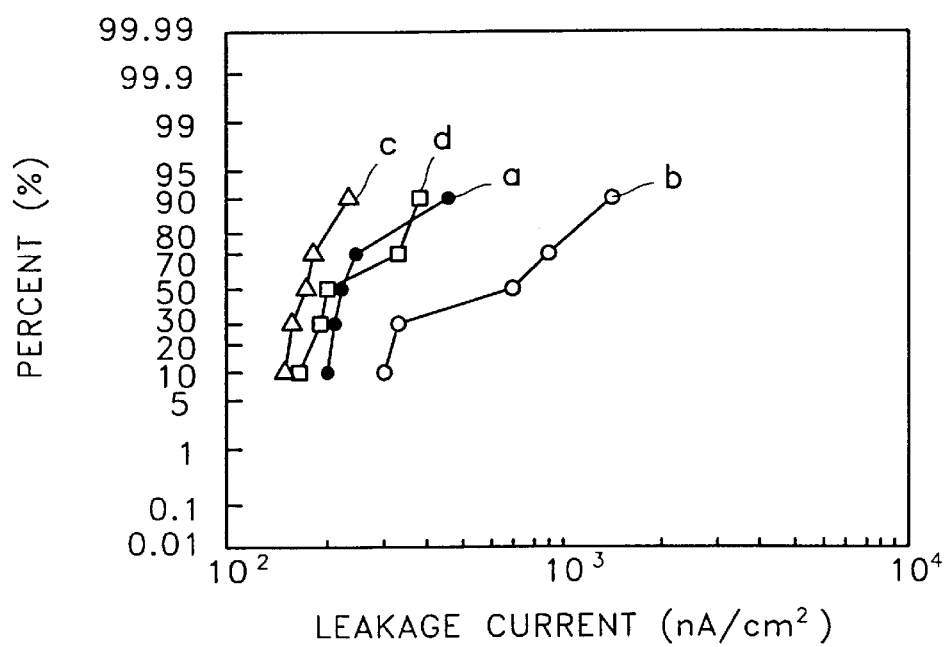

FIGS. 4A and 4B graphically illustrate a distribution of TOXEQs and a leakage current distribution when a voltage of 1.5 V is applied to the capacitor including a dielectric film of $Ta_2O_5$ at a thickness of 100Å on a storage electrode formed under various conditions. Reference characters a, b, c, and d indicate the results under the same conditions as those for FIGS. 3A and 3B.

Figure 5A:
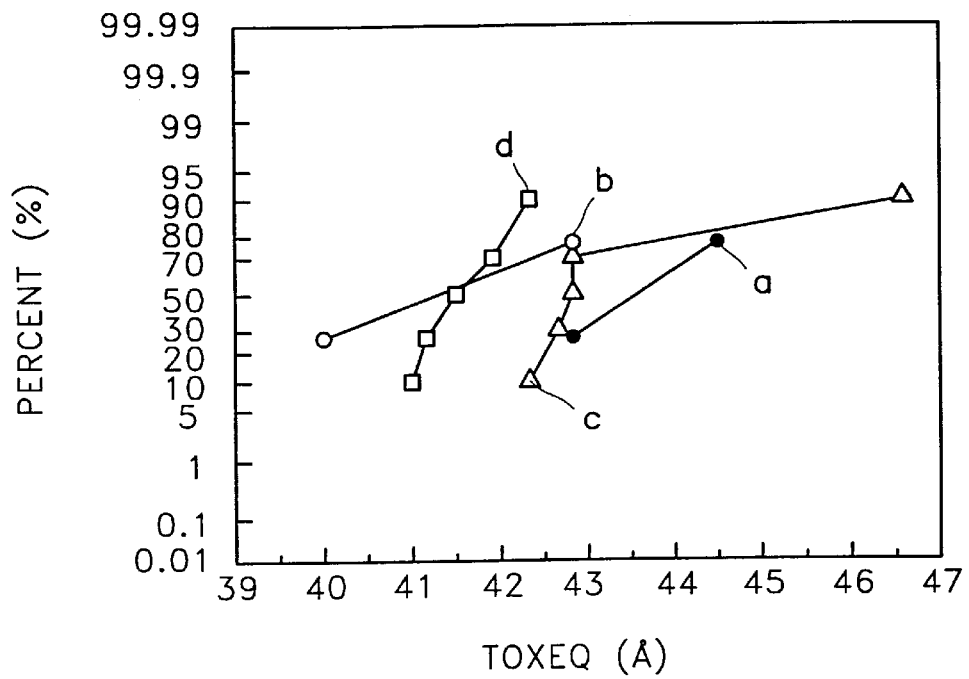
FIGS. 5A and 5B graphically illustrate a distribution of TOXEQs and leakage current distribution when a voltage of 1.5 V is applied to a capacitor including dielectric film of $Ta_2O_5$ at a thickness of 125Å on a storage electrode, formed under various conditions.
Figure 5B:
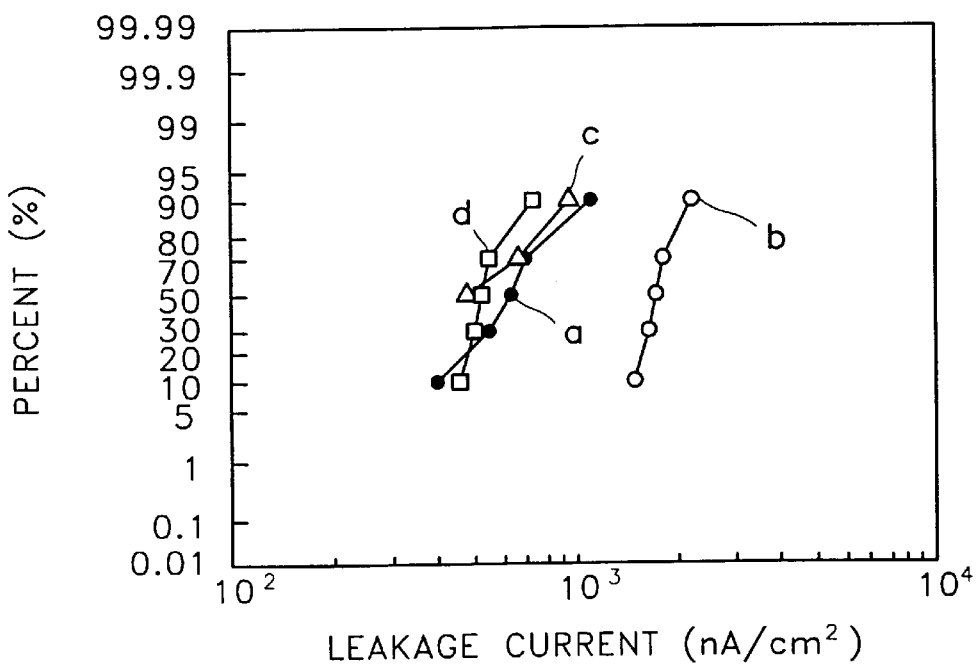

FIGS. 5A and 5B graphically illustrate a distribution of TOXEQs and a leakage current distribution when a voltage of 1.5 V is applied to the capacitor including a dielectric film of $Ta_2O_5$ at a thickness of 125Å on a storage electrode formed under various conditions. Reference characters a, b, c, and d indicate the results under the same conditions as those for FIGS. 3A and 3B.

From the above graphs, it can be seen that the thickness of an equivalent oxide film may be decreased by approximately 2Å and leakage current may be decreased by approximately $1 \times 10^{0.5}$ $nA/cm^2$ by the present invention where nitration and oxidation are sequentially performed on the surface of a storage electrode, compared with the prior art where the surface of the storage electrode was only nitrated. It can also be seen that as the $Ta_2O_5$ dielectric film is made thicker, the thickness of an equivalent oxide film and the leakage current also decreases.

Accordingly, methods for manufacturing a capacitor according to the present invention, which produce an SiON film by nitration and oxidation, can produce an oxygen barrier which is stronger than a conventional nitride film. The thickness of the dielectric film expressed in terms of that of an equivalent oxide film can thus be reduced. Residual $NH_3$ radical remaining at the surface of the resultant structure after the nitration process can also be reduced or eliminated during the oxidation process, thus reducing damage to the dielectric film. As a result, leakage current characteristics can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A microelectronic capacitor comprising:
   a conductive electrode on a microelectronic substrate;
   a silicon oxynitride film on said conductive electrode, opposite said microelectronic substrate;
   a tantalum pentoxide film on said silicon oxynitride film, opposite said conductive electrode, the tantalum pentoxide film being spaced apart from the conductive electrode by said silicon oxynitride film.

2. A microelectronic capacitor according to claim 1 further comprising:
   a second conductive electrode on said tantalum pentoxide film, opposite said silicon oxynitride film.

3. An integrated circuit comprising:
   a microelectronic substrate;
   an insulating layer on said microelectronic substrate, including a contact hole therein which exposes a portion of the microelectronic substrate;
   a conductive electrode on the insulating layer, opposite the microelectronic substrate and extending through said contact hole to electrically contact the exposed microelectronic substrate;
   a silicon oxynitride film on said conductive electrode, opposite said microelectronic substrate; and
   a tantalum pentoxide film on said silicon oxynitride film, opposite said conductive electrode, the tantalum pentoxide film being spaced apart from the conductive electrode by said silicon oxynitride film.

4. An integrated circuit according to claim 3 further comprising:
   a second conductive electrode on said tantalum pentoxide film, opposite said silicon oxynitride film.

* * * * *